US009575350B2

(12) United States Patent  
Mu et al.

(10) Patent No.: US 9,575,350 B2  
(45) Date of Patent: Feb. 21, 2017

(54) ARRAY SUBSTRATE AND MANUFACTURING METHOD THEREOF AND TOUCH PANEL (71) Applicants: BOE TECHNOLOGY GROUP CO., LTD., Beijing (CN); HEFEI OPTOELECTRONICS TECHNOLOGY CO., LTD., Hefei, Anhui (CN)

(72) Inventors: Suzhen Mu, Beijing (CN); Ming Hu, Beijing (CN)

(73) Assignees: BOE TECHNOLOGY GROUP CO., LTD., Beijing (CN); HEIFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 273 days.

(21) Appl. No.: 14/415,420

(22) PCT Filed: May 28, 2014

(86) PCT No.: PCT/CN2014/078660  
§ 371 (c)(1),  
(2) Date: Jan. 16, 2015

(87) PCT Pub. No.: WO2015/090005  
PCT Pub. Date: Jun. 25, 2015

(65) Prior Publication Data  
US 2015/0362773 A1    Dec. 17, 2015

(30) Foreign Application Priority Data  
Dec. 17, 2013  (CN) .......................... 2013 1 0699768

(51) Int. Cl.  
G02F 1/1333    (2006.01)  
G06F 3/041    (2006.01)  
(Continued)

(52) U.S. Cl.  
CPC ......... *G02F 1/13338* (2013.01); *G02F 1/1368* (2013.01); *G02F 1/133514* (2013.01);  
(Continued)

(58) Field of Classification Search  
USPC ............................... 349/12; 257/71; 438/158  
See application file for complete search history.

(56) References Cited

U.S. PATENT DOCUMENTS

2012/0038585 A1    2/2012  Kim

FOREIGN PATENT DOCUMENTS

CN    101153972 A    4/2008  
CN    101320185 A    12/2008  
(Continued)

OTHER PUBLICATIONS

International Search Report from PCT/CN2014/078660 dated May 28, 2014.  
(Continued)

*Primary Examiner* — Huyen Ngo  
(74) *Attorney, Agent, or Firm* — Nath, Goldberg & Meyer; Joshua B. Goldberg (57) ABSTRACT The present invention discloses an array substrate and a manufacturing method thereof, and a touch panel. The array substrate comprises a substrate and gate lines and data lines formed thereon. The gate lines and the data lines define pixel units, each of which comprises a display thin film transistor and a pixel electrode. Scanning lines, receiving lines and touch electrodes are also formed on the substrate. Each of a part or all of the pixel units further comprises a touch thin film transistor connected to the touch electrode, and the touch thin film transistor is connected to the scanning line and the receiving line. In the present invention, the display thin film transistors and the touch thin film transistors are simultaneously disposed in the pixel units.

20 Claims, 3 Drawing Sheets (51) Int. Cl.
- *G02F 1/1335* (2006.01)
- *G02F 1/1362* (2006.01)
- *G02F 1/1368* (2006.01)
- *H01L 27/12* (2006.01)
- *H01L 29/786* (2006.01)

(52) U.S. Cl.
CPC ...... *G02F 1/136286* (2013.01); *G06F 3/0412* (2013.01); *H01L 27/124* (2013.01); *H01L 27/1255* (2013.01); *H01L 27/1259* (2013.01); *H01L 29/78633* (2013.01)

(56) References Cited

FOREIGN PATENT DOCUMENTS

| | | |
|---|---|---|
| CN | 101446721 A | 6/2009 |
| CN | 102375258 A | 3/2012 |
| CN | 102455532 A | 5/2012 |
| CN | 103676280 A | 3/2014 |
| CN | 203688937 U | 7/2014 |

OTHER PUBLICATIONS

The First Office Action dated Sep. 1, 2015 corresponding to Chinese application No. 201310699768.8.

Written Opinion of the International Searching Authority dated Sep. 23, 2014 corresponding to International application No. PCT/CN2014/078660.

ARRAY SUBSTRATE AND MANUFACTURING METHOD THEREOF AND TOUCH PANEL

This is a National Phase Application filed under 35 U.S.C. 371 as a national stage of PCT/CN2014/078660, filed May 28, 2014, an application claiming the benefit of Chinese Application No. 201310699768.8, filed Dec. 17, 2013, the content of each of which is hereby incorporated by reference in its entirety.

FIELD OF THE INVENTION

The present invention relates to the field of display technology, and particularly to an array substrate and a manufacturing method thereof, and a touch panel.

BACKGROUND OF THE INVENTION

According to composition structures, touch panels may be classified into add on mode touch panels, on cell touch panels and in cell touch panels. An in cell touch panel is a touch panel formed by embedding touch electrodes of the touch panel inside a liquid crystal display panel.

An array substrates is an important component of a touch panel. In the prior art, an array substrate may include a substrate, and gate lines and data lines formed on the substrate. The gate lines and the data lines define pixel units, in which display thin film transistors and pixel electrodes are formed. Touch electrodes and touch thin film transistors are also formed on the substrate, the display thin film transistors and the touch thin film transistors are of a bottom-gate structure, and the touch thin film transistors are formed outside the pixel units.

In the prior art, as the display thin film transistors and the touch thin film transistors are provided separately, and the touch thin film transistors are individually formed outside the pixel units, and need to occupy the space outside the pixel units on the array substrate, so that the structure of the array substrate is complicated.

SUMMARY OF THE INVENTION

The present invention provides an array substrate and a manufacturing method thereof and a touch panel, so as to simplify the structure of the array substrate.

To achieve the above objective, embodiments of the present invention provide an array substrate comprising: a substrate; gate lines and data lines, which are formed on the substrate and define pixel units; a display thin film transistor and a pixel electrode, which are disposed in each of the pixel units; scanning lines, receiving lines and touch electrodes, which are formed above the substrate; and a touch thin film transistor, which is disposed in each of a part of or all of the pixel units and connected to the touch electrode, the scanning line and the receiving line.

A gate of the touch thin film transistor may be connected to the scanning line, a source of the touch thin film transistor may be connected to the touch electrode, and a drain of the touch thin film transistor may be connected to the receiving line.

The gates of the touch thin film transistors and the scanning lines may be provided in a same layer, the gates of the touch thin film transistors and the scanning lines may be located above the data lines, and the sources and drains of the touch thin film transistors, the receiving lines and the data lines may be provided in a same layer.

The sources and drains of the touch thin film transistors may be formed on active layers of the touch thin film transistors, and the sources and drains of the display thin film transistors may be formed on active layers of the display thin film transistors; the sources and drains of the touch thin film transistors and the sources and drains of the display thin film transistors may be provided in a same layer, and the active layers of the touch thin film transistors and the active layers of the display thin film transistors may be provided in a same layer.

The active layers of the display thin film transistors may be formed on the gates of the display thin film transistors, and the gates of the display thin film transistors and the gate lines may be provided in a same layer.

The array substrate may further include a first passivation layer, wherein the first passivation layer covers the sources and drains of the touch thin film transistors, the receiving lines and the data lines, and the scanning lines and the gates of the touch thin film transistors may be formed on the first passivation layer.

The touch electrodes and the pixel electrodes may be provided in a same layer, and the touch electrodes may be crisscrossed.

The array substrate may further include a second passivation layer, wherein the second passivation layer covers the scanning lines and the gates of the touch thin film transistors, and the touch electrodes and the pixel electrodes may be formed on the second passivation layer.

The array substrate may further include first shielding patterns provided in the same layer as the gate lines and second shielding patterns provided in the same layer as the scanning lines; the gates of the touch thin film transistors may be located above the first shielding patterns, and the second shielding patterns may be located above the gates of the display thin film transistors.

The gates of the touch thin film transistors may be partially or completely overlapped with the first shielding patterns, and the second shielding patterns may be partially or completely overlapped with the gates of the display thin film transistors.

The array substrate may further include common electrodes, wherein first storage capacitances and first liquid crystal capacitances are formed between the pixel electrodes and the common electrodes, and second storage capacitances and second liquid crystal capacitances are formed between the touch electrodes and the common electrodes.

The array substrate may further include a third passivation layer, wherein the third passivation layer covers the touch electrodes and the pixel electrodes, and the common electrodes may be formed on the third passivation layer.

To achieve the above objective, embodiments of the present invention provide a touch panel, including a color filter substrate and the above array substrate which are provided opposite to each other, with a liquid crystal layer provided between the color film substrate and the array substrate.

To achieve the above objective, the embodiments of the present invention provide a manufacturing method of an array substrate, including steps of:

forming gate lines, data lines, scanning lines, receiving lines, display thin film transistors and touch thin film transistors on a substrate, wherein the gate lines and the data lines define pixel units, in each of which the display thin film transistor is provided, the touch thin film transistor, which is connected to the scanning line and the receiving line, is provided in each of a part or all of the pixel units; and forming pixel electrodes and touch electrodes on the substrate, wherein the pixel electrodes are connected to the display thin film transistors, the touch electrodes are connected to the touch thin film transistors, and the pixel electrodes are located in the pixel units.

In the manufacturing method, the step of forming gate lines, data lines, scanning lines, receiving lines, display thin film transistors and touch thin film transistors on a substrate may include steps of:

forming the gate lines and the gates of the display thin film transistors on the substrate;

forming a gate insulating layer on the substrate, wherein the gate insulating layer is located on the gate lines and the gates of the display thin film transistors;

forming active layers of the display thin film transistors and active layers of the touch thin film transistors on the gate insulating layer;

forming the data lines, the receiving lines, the sources and drains of the display thin film transistors and the sources and drains of the touch thin film transistors on the substrate, wherein the sources and drains of the display thin film transistors are located on the active layers of the display thin film transistors, and the sources and drains of the touch thin film transistors are located on the active layers of the touch thin film transistors;

forming a first passivation layer on the substrate, wherein the first passivation layer is located on the data lines, the receiving lines, the sources and drains of the display thin film transistors and the sources and drains of the touch thin film transistors;

forming the scanning lines and the gates of the touch thin film transistors on the first passivation layer; and forming a second passivation layer on the substrate, wherein the second passivation layer is located on the scanning lines and the gates of the touch thin film transistors; and the step of forming pixel electrodes and touch electrodes on the substrate may include steps of:

forming first via holes and second via holes penetrating through the first passivation layer and the second passivation layer in the first passivation layer and the second passivation layer, wherein the first via holes are located above the drains of the display thin film transistors, and the second via holes are located above the drains of the touch thin film transistors; and forming the pixel electrodes and the touch electrodes on the second passivation layer, wherein the pixel electrodes are connected to the drains of the display thin film transistors through the first via holes, and the touch electrodes are connected to the drains of the touch thin film transistors through the second via holes.

In the technical solutions of the array substrate and manufacturing method thereof and the touch panel provided by the embodiments of the present invention, each pixel unit includes a display thin film transistor and each of a part or all of the pixel units include a touch thin film transistor which is formed in the pixel unit, the display thin film transistor and the touch thin film transistor are simultaneously disposed in the pixel unit, without occupying the space outside the pixel unit on the array substrate, thus the structure of the array substrate is simplified.

DESCRIPTION OF THE PREFERRED EMBODIMENT

To make those skilled in the art better understand the technical solutions of the present invention, the array substrate and the manufacturing method thereof and the touch panel provided by the present invention will be described as below in details in conjunction with the accompanying drawings.

Figure 1:
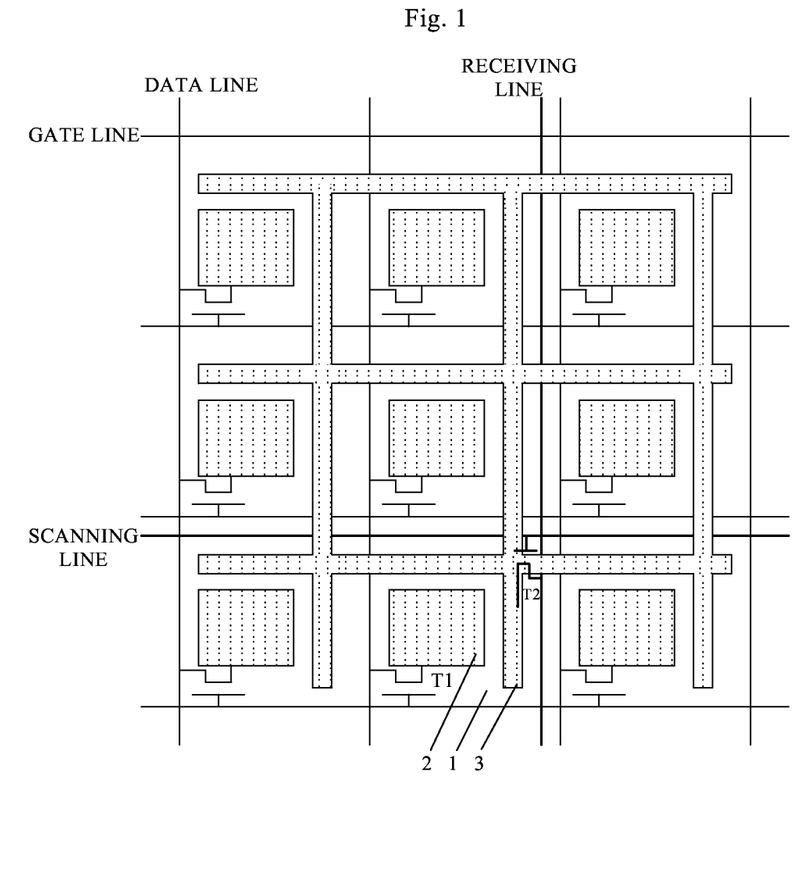
FIG. 1 is a diagram of a structure of an array substrate provided by a first embodiment of the present invention.

FIG. 1 is a diagram of a structure of an array substrate provided by a first embodiment of the present invention. As shown in FIG. 1, the array substrate comprises a substrate with gate lines and data lines formed thereon. The gate lines and the data lines define pixel units 1, each of which comprises a display thin film transistor T1 and a pixel electrode 2. Scanning lines, receiving lines and touch electrodes 3 are also formed on the substrate, and each of a part or all of the pixel units 1 further includes a touch thin film transistor T2 connected to the touch electrode 3. The touch thin film transistor T2 is connected to the scanning line and the receiving line, and is a top-gate type thin film transistor. The substrate is not specifically shown in FIG. 1.

In this embodiment, each of the pixel units 1 may comprise a touch thin film transistor T2, or each of a part of pixel units 1 may comprise a touch thin film transistor T2. In some embodiments, one pixel may include one touch thin film transistor T2 and may include a plurality of pixel units 1, and in this case, the touch thin film transistor T2 may be disposed in any one pixel unit 1 in the pixel. It should be noted that, only one thin film transistor T2 and one scanning line and one receiving line connected thereto are shown in FIG. 1 as an example, but those skilled in the art should understand that the numbers of the touch thin film transistors T2 and the scanning lines and receiving lines connected thereto are not limited thereto in practical applications.

In this embodiment, the touch thin film transistors T2 are top-gate type thin film transistors. Each touch thin film transistor T2 comprises a gate, an active layer, a source and a drain. The gate of the touch thin film transistor T2 is connected to the scanning line, the source of the touch thin film transistor T2 is connected to the touch electrode 3, and the drain of the touch thin film transistor T2 is connected to the receiving lines. In some embodiments, the touch electrodes 3 and the pixel electrodes 2 are provided in a same layer, and the touch electrodes 3 are crisscrossed. The gates of the touch thin film transistors T2 and the scanning lines are provided in a same layer, and the gates of the touch thin film transistors T2 and the scanning lines are located above the data lines. The sources of the touch thin film transistors T2, the drains of the touch thin film transistors T2, the receiving lines and the data lines are provided in a same layer. The sources and drains of the touch thin film transistors T2 are located on the active layers of the touch thin film transistors T2.

In this embodiment, the display thin film transistors T1 are bottom-gate type thin film transistors. Each display thin film transistor T1 comprises a gate, an active layer, a source and a drain. The gate of the display thin film transistor T1 is connected to the gate line, the source of the display thin film transistor T1 is connected to the data line, and the drain of the display thin film transistor T1 is connected to the pixel electrode 2. The gates of the display thin film transistors T1 are located on the substrate and provided in the same layer as the gate lines. A gate insulating layer is formed on the gates of the display thin film transistors T1 and the gate lines; the active layers of the display thin film transistors T1 are formed on the gate insulating layer, and the active layers of the touch thin film transistors T2 are provided in the same layer as the active layers of the display thin film transistors T1. The sources and drains of the display thin film transistors T1 are formed on the active layers, the receiving lines and the data lines are located on the gate insulating layer, and the receiving lines, the data lines and the sources and drains of the display thin film transistors T1 are provided in a same layer. The sources and drains of the touch thin film transistors T2 are provided in the same layer as the sources and drains of the display thin film transistors T1. A first passivation layer is formed on the receiving lines, the data lines, the sources and drains of the display thin film transistors T1 and the sources and drains of the touch thin film transistors T2, and the gates of the touch thin film transistors T2 and the scanning lines are formed on the first passivation layer. A second passivation layer is formed on the gates of the touch thin film transistors T2 and the scanning lines, the pixel electrodes 2, which are connected to the drains of the display thin film transistors T1 through first via holes provided in both the first passivation layer and the second passivation layer, are formed on the second passivation layer, and the touch electrodes 3 are connected to the drains of the touch thin film transistors T2 through second via holes provided in both the first passivation layer and the second passivation layer.

Figure 2:
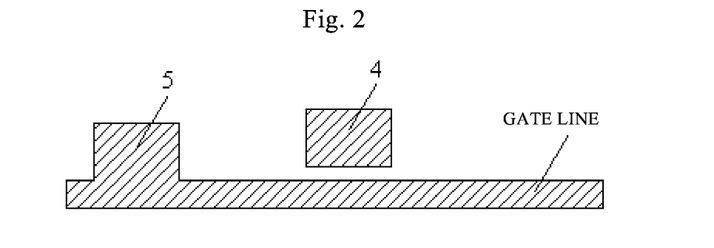
FIG. 2 is a diagram of a structure of a gate layer of a display thin film transistor in FIG. 1.

FIG. 2 is a diagram of a structure of a gate layer of a display thin film transistor T1 in FIG. 1. As shown in FIG. 2, the gate layer include a gate 5, a gate line, and a first shielding pattern 4 provided in the same layer as the gate line. The gate 5 of the display thin film transistor T1 is connected to the gate line, and the gate 5 of the display thin film transistor T1 and the gate line are formed as a whole.

Figure 3:
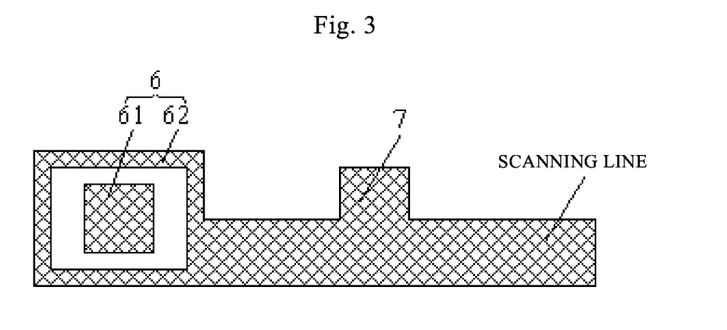
FIG. 3 is a diagram of a structure of a gate layer of a touch thin film transistor in FIG. 1.

FIG. 3 is a diagram of a structure of a gate layer of the touch thin film transistor T2 in FIG. 1. As shown in FIG. 3, the gate layer includes a gate 7, a scanning line and a second shielding pattern 6 provided in the same layer as the scanning line. The gate 7 of the touch thin film transistor T2 is connected to the scanning line, and the gate 7 of the touch thin film transistor T2 and the scanning line are formed as a whole. In this embodiment, the second shielding pattern 6 includes a first shielding sub-pattern 61 and a second shielding sub-pattern 62. The second shielding sub-pattern 62 is of an annular structure and is provided around the first shielding sub-pattern 61.

Figure 4:
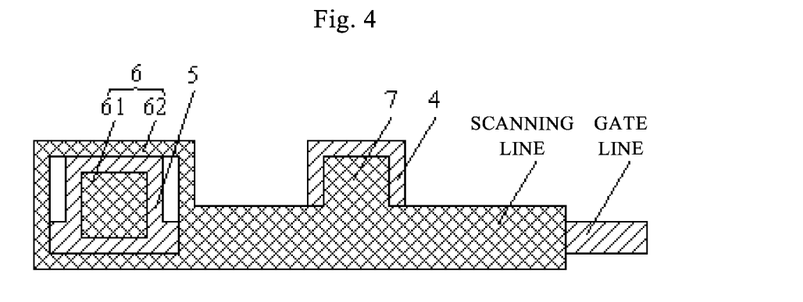
FIG. 4 is a schematic diagram of a positional relation between the gate layer of a display thin film transistor and the gate layer of a touch thin film transistor in FIG. 1.

FIG. 4 is a schematic diagram of a positional relation between the gate layer of the display thin film transistor T1 and the gate layer of the touch thin film transistor T2 in FIG. 1. As shown in FIG. 4, the gate 7 of the touch thin film transistor T2 is located above the first shielding pattern 4, and the second shielding pattern 6 is located above the gate 5 of the display thin film transistor T1. The second shielding pattern 6 may shield the gate 5 of the display thin film transistor T1 so as to shield the channel of the display thin film transistor T1, so that the influence of ambient light on the channel of the display thin film transistor T1 is effectively avoided, and the leak current in the display thin film transistor T1 resulted from the ambient light is reduced. The first shielding pattern 4 may shield the gate 7 of the touch thin film transistor T2 so as to shield the channel of the touch thin film transistor T2, so that the influence of backlight on the channel of the touch thin film transistor T2 is effectively avoided, and the leak current in the touch thin film transistor T2 resulted from the backlight is reduced. It also can be seen from FIG. 4 that the scanning line is located above the gate line.

With reference to FIG. 2 to FIG. 4, specifically, the gate 7 of the touch thin film transistor T2 may be partially or completely overlapped with the first shielding pattern 4, and the second shielding pattern 6 may be partially or completely overlapped with the gate 5 of the display thin film transistor T1. In some embodiments, the gate 7 of the touch thin film transistor T2 is partially overlapped with the first shielding pattern 4, and the second shielding pattern 6 is partially overlapped with the gate 5 of the display thin film transistor T1. It can be seen from FIG. 4 that the gate 7 of the touch thin film transistor T2 covers a middle portion of the first shielding pattern 4 but do not cover an edge of the first shielding pattern 4, and since the first shielding pattern 4 is not connected to the gate line, and a gap between the first shielding pattern 4 and the gate line is not covered by the gate 7 of the touch thin film transistor T2, the gate 7 of the touch thin film transistor T2 is overlapped with a portion of the first shielding pattern 4. In addition, the second shielding sub-pattern 62 is provided around the gate 5 of the display thin film transistor T1, the first shielding sub-pattern 61 covers a portion of the gate 5 of the thin film transistor T1, and therefore the second shielding pattern 6 is partially overlapped with the gate 5 of the thin film transistor T1. In the present embodiment, the gate 7 of the touch thin film transistor T2 is overlapped with a portion of the first shielding pattern 4, so that the influence of the gate signal applied to the gate line on the touch thin film transistor T2 is effectively avoided. The second shielding pattern 6 is partially overlapped with the gate 5 of the display thin film transistor T1, so that the influence of the scanning signal applied to the scanning line on the display thin film transistor T1 is effectively avoided. Also, it can be seen from FIG. 4 that the scanning line may be partially or completely overlapped with the gate line. In some embodiments, the scanning line is partially overlapped with the gate line. The width of the scanning line is larger than that of the gate line, however, at a position where the gate line and the gate 5 of the display thin film transistor T1 are connected, the width of the scanning line is smaller than that of the gate line, and thus the scanning line is partially overlapped with the gate line.

Figure 5:
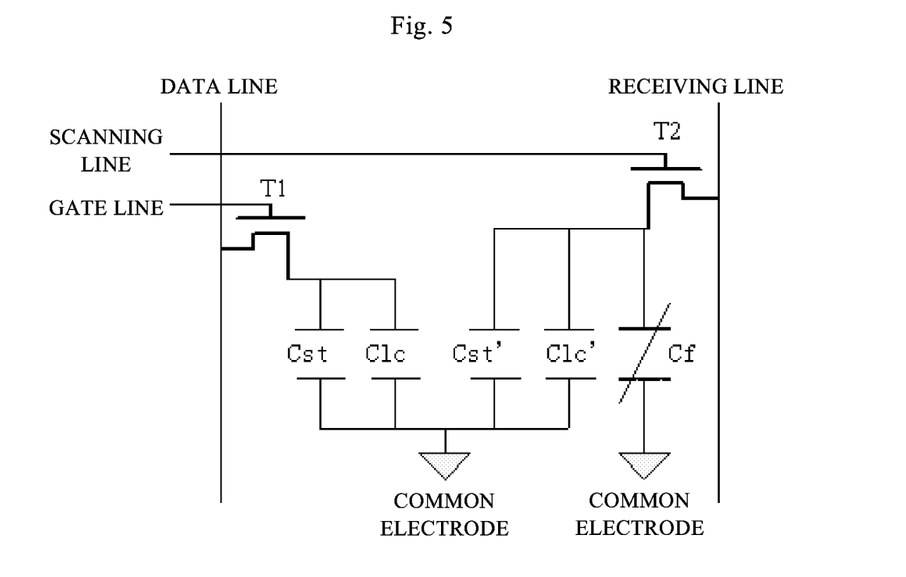
FIG. 5 is an equivalent circuit diagram of the array substrate in FIG. 1.

FIG. 5 is an equivalent circuit diagram of the array substrate in FIG. 1. As shown in FIGS. 1 and 5, the array substrate further includes common electrodes. In some embodiments, a third passivation layer is formed on the pixel electrodes 2, and the common electrodes are formed on the third passivation layer. The common electrodes are not specifically shown in FIG. 1. First storage capacitances Cst and first liquid crystal capacitances Clc are formed between the pixel electrodes 2 and the common electrodes, and second storage capacitances Cst' and second liquid crystal capacitances Clc' are formed between the touch electrodes 3 and the common electrodes.

In this embodiment, the array substrate is an Advanced Super Dimension Switch (ADS) type array substrate or an In-Plane Switching (IPS) type array substrate, and in this case, the common electrodes are provided in the array substrate.

In practical applications, alternatively, the array substrate may be a Twisted Nematic (TN) type array substrate, and in this case, the common electrodes are provided in a color filter substrate.

Figure 6:
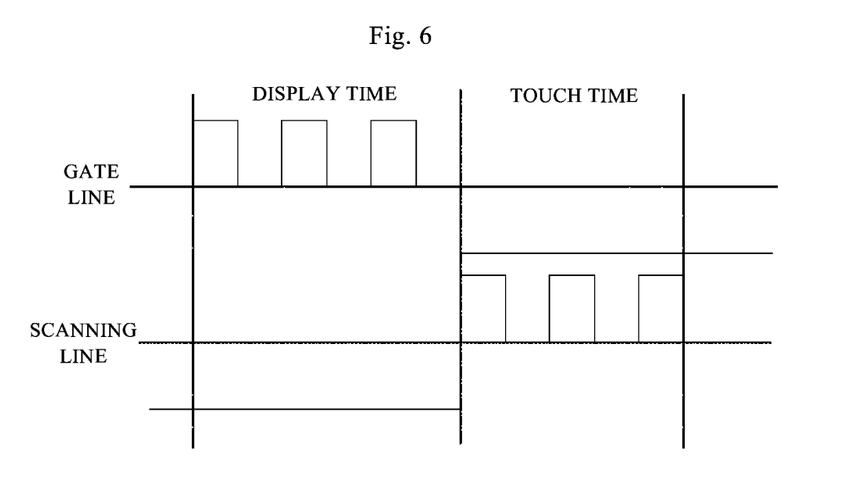
FIG. 6 is a signal timing diagram of a gate line and a scanning line.

FIG. 6 is a signal timing diagram of a gate line and a scanning line. The working principle of the array substrate in this embodiment will be described as below in details in conjunction with FIGS. 5 and 6.

In a display time, a gate signal is applied to the gate line, and the display thin film transistor T1 is turned on under the control of the gate signal output by the gate line, and as shown in FIG. 6, at this point, the gate signal is a high level signal. The data line outputs a data signal to the pixel electrode through the turned-on display thin film transistor T1, so that a charge voltage is written into the first storage capacitance Cst and the first liquid crystal capacitance Clc. Meanwhile, in the display time, as the scanning signal applied to the scanning line is a low level signal, the touch thin film transistor T2 is turned off.

In a touch time, a scanning signal is applied to the scanning line, and the touch thin film transistor T2 is turned on under the control of the scanning signal output by the scanning line, and as shown in FIG. 6, at this point, the scanning signal is a high level signal. When no touch is performed, the receiving line outputs an initial voltage signal on the second storage capacitance Cst' and the second liquid crystal capacitance Clc'. When a touch is performed, the value of the second liquid crystal capacitance Clc' is changed, which is equivalent to that a capacitance Cf is connected in parallel, and at this point, the voltages on the second storage capacitance Cst' and the second liquid crystal capacitance Clc' are changed, so that the receiving line outputs the changed touch voltage signal. The touch position may be determined according to the touch voltage signal. Meanwhile, in the touch time, as the scanning signal applied to the gate line is a low level signal, the display thin film transistor T1 is turned off.

In this embodiment, if the array substrate is an array substrate of a dual gate structure, then the receiving lines may utilize dummy data lines. As such, no receiving line needs to be provided separately, thus saving the space on the array substrate, and simplifying the circuit structure.

In the array substrate provided by this embodiment, each pixel unit includes a display thin film transistor, and each of a part or all of the pixel units includes a touch thin film transistor, which is a top-gate thin film transistor, and is formed in the pixel unit, and as a result, the display thin film transistor and the touch thin film transistor are simultaneously disposed in the pixel unit, without occupying the space outside the pixel unit on the array substrate, so that the structure of the array substrate is simplified. As the receiving lines, the sources and drains of the touch thin film transistors may be provided in the same layer as the data lines and the sources and drains of the display thin film transistors, sharing one layer of source-drain metal is realized, thus the structure of the array substrate is further simplified, and the manufacturing process is simple and easy to implement.

A second embodiment of the present invention provides a touch panel, comprising: a color filter substrate and an array substrate which are provided opposite to each other, and a liquid crystal layer provided between the color filter substrate and the array substrate. The array substrate adopts the array substrate provided by the first embodiment and will not be repeated here.

In the touch panel provided by this embodiment, each pixel unit includes a display thin film transistor, and each of a part or all of the pixel units includes a touch thin film transistor, which is a top-gate thin film transistor, and is formed in the pixel unit, and as a result, the display thin film transistor and the touch thin film transistor are simultaneously disposed in the pixel units, without occupying the space outside the pixel unit on the array substrate, thus the structure of the array substrate is simplified. As the receiving lines, the sources and drains of the touch thin film transistors may be provided in the same layer as the data lines and the sources and drains of the display thin film transistors, sharing one layer of source-drain metal is realized, thus the structure of the array substrate is further simplified, and the manufacturing process is simple and easy to implement.

Figure 7:
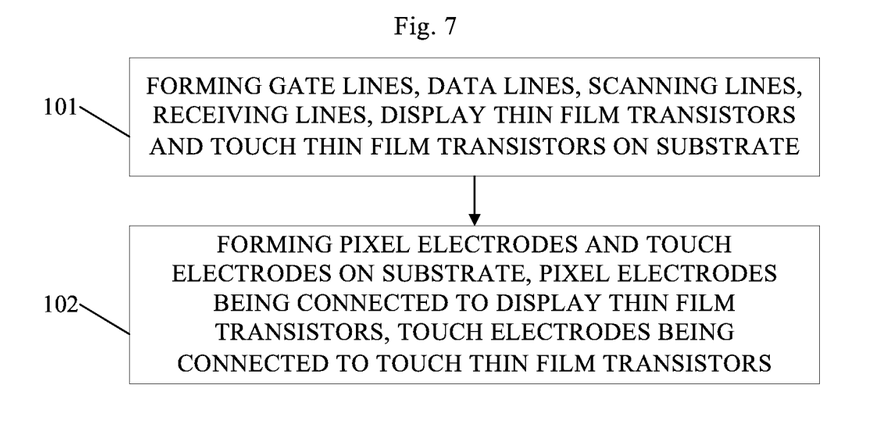
FIG. 7 is a flowchart of a manufacturing method of an array substrate provided by a third embodiment of the present invention.

FIG. 7 is a flowchart of a manufacturing method of an array substrate provided by a third embodiment of the present invention. As shown in FIG. 7, the method includes steps 101 and 102.

In step 101, gate lines, data lines, scanning lines, receiving lines, display thin film transistors and touch thin film transistors are formed on a substrate, the gate lines and the data lines define pixel units, the display thin film transistors are provided in the pixel units, and the touch thin film transistors are provided in a part or all of the pixel units.

In this embodiment, step 101 may specifically include steps 1011 to 1017.

In step 1011, the gate lines and the gates of the display thin film transistors are formed on the substrate.

Specifically, a gate metal layer is formed on the substrate, and then a patterning process is performed on the gate metal layer to form the gate lines and the gates of the display thin film transistors. Optionally, if the array substrate includes first shielding patterns provided in the same layer as the gate lines, then in this step, the first shielding patterns are formed while forming the gate lines and the gates of the display thin film transistors.

In step 1012, a gate insulating layer is formed on the substrate, the gate insulating layer is provided on the gate lines and the gates of the display thin film transistors.

Optionally, the gate insulating layer is also located on the first shielding patterns.

In step 1013, active layers of the display thin film transistors and active layers of the touch thin film transistors are formed on the gate insulating layer. The active layers of the display thin film transistors are provided to correspond to the gates of the display thin film transistors.

In step 1014, the data lines, the receiving lines, the sources and drains of the display thin film transistors and the sources and drains of the touch thin film transistors are formed on the substrate, wherein the sources and drains of the display thin film transistors are provided on the active layers of the display thin film transistors, and the sources and drains of the touch thin film transistors are provided on the active layers of the touch thin film transistors.

Specifically, a source-drain metal layer is formed on the substrate, and then a patterning process is performed on the source-drain metal layer to form the data lines, the receiving lines, the sources and drains of the display thin film transistors and the sources and drains of the touch thin film transistors.

In step 1015, a first passivation layer is formed on the substrate, wherein the first passivation layer is located on the data lines, the receiving lines, the sources and drains of the display thin film transistors and the sources and drains of the touch thin film transistors.

In step 1016, the scanning lines and the gates of the touch thin film transistors are formed on the first passivation layer.

Specifically, a gate metal layer is formed on the substrate, and then a patterning process is performed on the gate metal layer to form the scanning lines and the gates of the touch thin film transistors. Optionally, if the array substrate includes second shielding patterns provided in the same layer as the scanning layers, then in this step the second shielding patterns are formed while forming the scanning lines and the gates of the touch thin film transistors.

In step 1017, a second passivation layer is formed on the substrate, wherein the second passivation layer is located on the scanning lines and the gates of the touch thin film transistors.

In addition, in step 102, pixel electrodes and touch electrodes are formed on the substrate, the pixel electrodes are connected to the display thin film transistors, the touch electrodes are connected to the touch thin film transistors, the pixel electrodes are located in the pixel units, the scanning lines are connected to the receiving lines through the touch thin film transistors, and the touch thin film transistors are top-gate type thin film transistors.

In this embodiment, step 102 may specifically include steps 1021 to 1023.

In step 1021, first via holes and second via holes are formed in the first passivation layer and the second passivation layer, the first via holes are located above the drains of the display thin film transistors, and the second via holes are located above the drains of the touch thin film transistors.

Optionally, step 1021 specifically includes: coating a photoresist on the second passivation layer, performing exposure with a mask, then performing development, etching and photoresist stripping, so as to form the first via holes and the second via holes penetrating through the first passivation layer and the second passivation layer in the first passivation layer and the second passivation layer. Here, the mask is used for forming the first via holes and the second via holes. In this solution, the first via holes and the second via holes are simultaneously formed by using only one mask, thereby saving the cost of the mask.

In step 1022, the pixel electrodes and the touch electrodes are formed on the substrate, the pixel electrodes are connected to the drains of the display thin film transistors through the first via holes, and the touch electrodes are connected to the drains of the touch thin film transistors through the second via holes.

Specifically, a transparent conducting layer is formed on the second passivation layer, and then a patterning process is performed on the transparent conducting layer to form the pixel electrodes and the touch electrodes. The pixel electrodes fill the first via holes to realize the connection with the drains of the display thin film transistors, and the touch electrodes fill the second via holes to realize the connection with the drains of the touch thin film transistors.

In step 1023, a third passivation layer is formed on the substrate, and the third passivation layer is located on the pixel electrodes and the touch electrodes.

In the embodiment of the present invention, the array substrate may further include common electrodes, and the method further includes step S103.

In step 103, common electrodes are formed on the third passivation layer.

In this embodiment, a patterning process may include: photoresist coating, exposure, developing, etching, photoresist stripping and other processes.

The manufacturing method of an array substrate provided by this embodiment may be used for manufacturing the array substrate provided by the first embodiment. The description of the specific structure of the array substrate may refer to the first embodiment and will not be repeated here.

In the array substrate manufactured by using the manufacturing method of the array substrate provided by this embodiment, each pixel unit includes a display thin film transistor, and each of a part or all of the pixel units includes a touch thin film transistor, which is a top-gate thin film transistor, and is formed in the pixel units, and as a result, the display thin film transistor and the touch thin film transistor are simultaneously disposed in the pixel unit, without occupying the space outside the pixel unit on the array substrate, thus the structure of the array substrate is simplified. As the receiving lines and the sources and drains of the touch thin film transistors may be provided in a same layer as the data lines and the sources and drains of the display thin film transistors, sharing one layer of source-drain metal is realized, thus the structure of the array substrate is further simplified, and the manufacturing process is simple and easy to implement.

It should be understood that, the implementations described above are merely exemplary implementations for describing the principle of the present invention, but the present invention is not limited thereto. For the persons skilled in the art, various variations and improvements may be made without departing from the spirit and essence of the present invention, and these variations and improvements shall be deemed as falling within the protection scope of the present invention.

The invention claimed is:

1. An array substrate, comprising:
   a substrate;
   gate lines and data lines, which are formed on the substrate and define pixel units;
   a display thin film transistor and a pixel electrode, which are disposed in each of the pixel units;
   scanning lines, receiving lines and touch electrodes, which are formed above the substrate; and
   a touch thin film transistor, which is disposed in each of a part or all of the pixel units and connected to the touch electrode, the scanning line and the receiving line.

2. The array substrate according to claim 1, wherein a gate of the touch thin film transistor is connected to the scanning line, a source of the touch thin film transistor is connected to the touch electrode, and a drain of the touch thin film transistor is connected to the receiving line.

3. The array substrate according to claim 2, wherein the touch electrodes and the pixel electrodes are provided in a same layer, and the touch electrodes are crisscrossed.

4. The array substrate according to claim 3, further comprising a second passivation layer, wherein the second passivation layer covers the scanning lines and the gates of the touch thin film transistors, and the touch electrodes and the pixel electrodes are formed on the second passivation layer.

5. The array substrate according to claim 2, wherein the array substrate further comprises first shielding patterns provided in the same layer as the gate lines and second shielding patterns provided in the same layer as the scanning lines; and the gates of the touch thin film transistors are provided above the first shielding patterns, and the second shielding patterns are provided above the gates of the display thin film transistors.

6. The array substrate according to claim 5, wherein the gates of the touch thin film transistors are partially or completely overlapped with the first shielding patterns, and the second shielding pattern are partially or completely overlapped with the gates of the display thin film transistors.

7. The array substrate according to claim 2, wherein the gates of the touch thin film transistors and the scanning lines are provided in a same layer, the gates of the touch thin film transistors and the scanning lines are provided above the data lines, and the sources and drains of the touch thin film transistors, the receiving lines and the data lines are provided in a same layer.

8. The array substrate according to claim 7, wherein the sources and drains of the touch thin film transistors are formed on active layers of the touch thin film transistors, and the sources and drains of the display thin film transistors are formed on active layers of the display thin film transistors; and
the sources and drains of the touch thin film transistors and the sources and drains of the display thin film transistors are provided in a same layer, and the active layers of the touch thin film transistors and the active layers of the display thin film transistors are provided in a same layer.

9. The array substrate according to claim 8, wherein the active layers of the display thin film transistors are formed on the gates of the display thin film transistors, and the gates of the display thin film transistors and the gate lines are provided in a same layer.

10. The array substrate according to claim 7, further comprising a first passivation layer, wherein the first passivation layer covers the sources and drains of the touch thin film transistors, the receiving lines and the data lines, and the scanning lines and the gates of the touch thin film transistors are formed on the first passivation layer.

11. The array substrate according to claim 1, further comprising common electrodes, wherein first storage capacitances and first liquid crystal capacitances are formed between the pixel electrodes and the common electrodes, and second storage capacitances and second liquid crystal capacitances are formed between the touch electrodes and the common electrodes.

12. The array substrate according to claim 11, further comprising a third passivation layer, wherein the third passivation layer covers the touch electrodes and the pixel electrodes, and the common electrodes are formed on the third passivation layer.

13. A touch panel, comprising a color filter substrate and an array substrate which are provided opposite to each other, with a liquid crystal layer being provided between the color film substrate and the array substrate, wherein the array substrate comprises:
a substrate;
gate lines and data lines, which are formed on the substrate and define pixel units;
a display thin film transistor and a pixel electrode, which are disposed in each of the pixel units;
scanning lines, receiving lines and touch electrodes, which are formed above the substrate; and
a touch thin film transistor, which is disposed in each of a part or all of the pixel units and connected to the touch electrode, the scanning line and the receiving line.

14. The touch panel according to claim 13, wherein a gate of the touch thin film transistor is connected to the scanning line, a source of the touch thin film transistor is connected to the touch electrode, and a drain of the touch thin film transistor is connected to the receiving line.

15. The touch panel according to claim 14, wherein the gates of the touch thin film transistors and the scanning lines are provided in a same layer, the gates of the touch thin film transistors and the scanning lines are provided above the data lines, and the sources and drains of the touch thin film transistors, the receiving lines and the data lines are provided in a same layer.

16. The touch panel according to claim 15, wherein the sources and drains of the touch thin film transistors are formed on active layers of the touch thin film transistors, and the sources and drains of the display thin film transistors are formed on active layers of the display thin film transistors; and
the sources and drains of the touch thin film transistors and the sources and drains of the display thin film transistors are provided in a same layer, and the active layers of the touch thin film transistors and the active layers of the display thin film transistors are provided in a same layer.

17. The touch panel according to claim 16, wherein the active layers of the display thin film transistors are formed on the gates of the display thin film transistors, and the gates of the display thin film transistors and the gate lines are provided in a same layer.

18. The touch panel according to claim 13, wherein the touch electrodes and the pixel electrodes are provided in a same layer, and the touch electrodes are crisscrossed.

19. A manufacturing method of an array substrate, comprising steps of:
forming gate lines, data lines, scanning lines, receiving lines, display thin film transistors and touch thin film transistors on a substrate, wherein the gate lines and the data lines define pixel units, in each of which the display thin film transistor is provided, and the touch thin film transistor, which is connected to the scanning line and the receiving line, is provided in each of a part or all of the pixel units; and
forming pixel electrodes and touch electrodes on the substrate, wherein the pixel electrodes are connected to the display thin film transistors, the touch electrodes are connected to the touch thin film transistors, and the pixel electrodes are provided in the pixel units.

20. The manufacturing method of an array substrate according to claim 19, wherein, the step of forming gate lines, data lines, scanning lines, receiving lines, display thin film transistors and touch thin film transistors on a substrate comprises steps of:
forming the gate lines and the gates of the display thin film transistors on the substrate;
forming a gate insulating layer on the substrate, wherein the gate insulating layer is provided on the gate lines and the gates of the display thin film transistors;
forming active layers of the display thin film transistors and active layers of the touch thin film transistors on the gate insulating layer;
forming the data lines, the receiving lines, the sources and drains of the display thin film transistors and the sources and drains of the touch thin film transistors on the substrate, wherein the sources and drains of the display thin film transistors are provided on the active layers of the display thin film transistors, and the sources and drains of the touch thin film transistors are provided on the active layers of the touch thin film transistors;

forming a first passivation layer on the substrate, wherein the first passivation layer is provided on the data lines, the receiving lines, the sources and drains of the display thin film transistors and the sources and drains of the touch thin film transistors;

forming the scanning lines and gates of the touch thin film transistors on the first passivation layer; and forming a second passivation layer on the substrate, wherein the second passivation layer is provided on the scanning lines and the gates of the touch thin film transistors, and the step of forming pixel electrodes and touch electrodes on the substrate comprises steps of:

forming first via holes and second via holes penetrating through the first passivation layer and the second passivation layer in the first passivation layer and the second passivation layer, wherein the first via holes are provided above the drains of the display thin film transistors, and the second via holes are provided above the drains of the touch thin film transistors; and forming the pixel electrodes and the touch electrodes on the second passivation layer, wherein the pixel electrodes are connected to the drains of the display thin film transistors through the first via holes, and the touch electrodes are connected to the drains of the touch thin film transistors through the second via holes.

* * * * *